(12) United States Patent
Ogawa

(10) Patent No.: US 12,494,772 B2
(45) Date of Patent: Dec. 9, 2025

(54) SEMICONDUCTOR CIRCUIT

(71) Applicant: Sony Semiconductor Solutions Corporation, Kanagawa (JP)

(72) Inventor: Minetoshi Ogawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/714,727

(22) PCT Filed: Nov. 22, 2022

(86) PCT No.: PCT/JP2022/043240
§ 371 (c)(1),
(2) Date: May 30, 2024

(87) PCT Pub. No.: WO2023/135942
PCT Pub. Date: Jul. 20, 2023

(65) Prior Publication Data
US 2025/0030406 A1   Jan. 23, 2025

(30) Foreign Application Priority Data

Jan. 17, 2022 (JP) ................................. 2022-004938

(51) Int. Cl.
*H03K 17/00* (2006.01)
*H03K 3/037* (2006.01)

(52) U.S. Cl.
CPC ................................... *H03K 3/037* (2013.01)

(58) Field of Classification Search
CPC .......... H03K 3/02; H03K 3/027; H03K 3/037; H03K 3/0375; H03K 17/00; H03K 17/002; H03K 17/005; H03K 17/007; H03K 17/296; H03K 19/20; H03K 19/23
See application file for complete search history.

(56) References Cited

U.S. PATENT DOCUMENTS 6,127,864 A * 10/2000 Mavis .................. H03K 3/0375
327/295
9,912,323 B1 * 3/2018 Ardalan ................. H03K 5/135

FOREIGN PATENT DOCUMENTS

| JP | S61117954 A | 6/1986 |
| JP | H01130240 A | 5/1989 |
| JP | H06231593 A | 8/1994 |

OTHER PUBLICATIONS

International Search Report (PCT/ISA/210), International Application No. PCT/JP2022/043240, dated Feb. 14, 2023.

* cited by examiner

*Primary Examiner* — Long Nguyen
(74) *Attorney, Agent, or Firm* — Michael Best & Friedrich LLP

(57) ABSTRACT

A semiconductor circuit according to an embodiment of the present disclosure includes an input terminal, a plurality of latch circuits configured to sequentially acquire data at the input terminal and each configured to perform an acquisition operation for acquiring the data at the input terminal or a holding operation for holding the acquired data, in accordance with a voltage level of a corresponding control signal out of a plurality of control signals, a selector configured to perform a selection output operation for sequentially selecting any one of pieces of the data held by the plurality of latch circuits and for outputting the selected data, and a control circuit configured to control the operations of the plurality of latch circuits and the selector.

4 Claims, 6 Drawing Sheets

[FIG. 1]
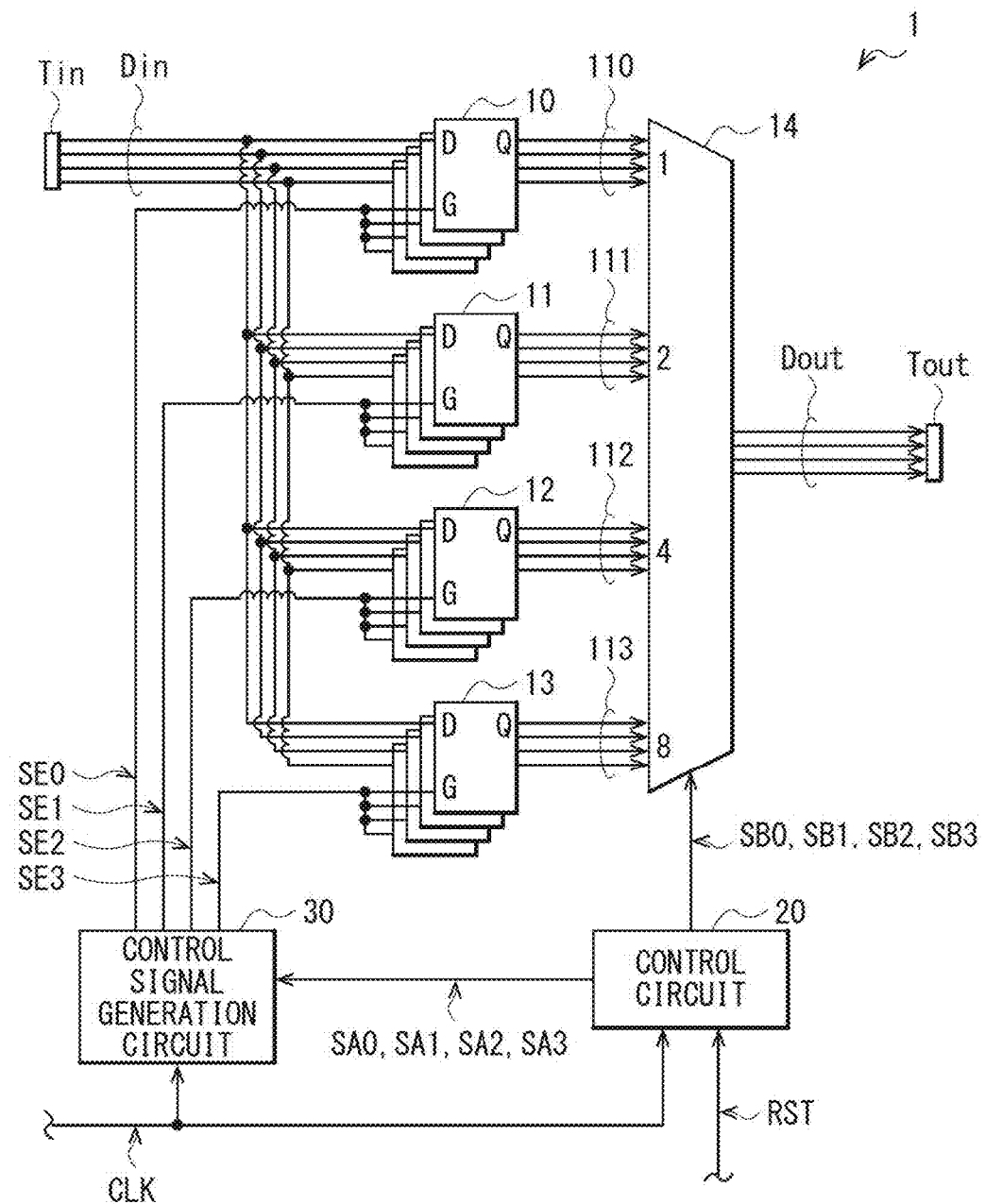

[ FIG. 2 ]
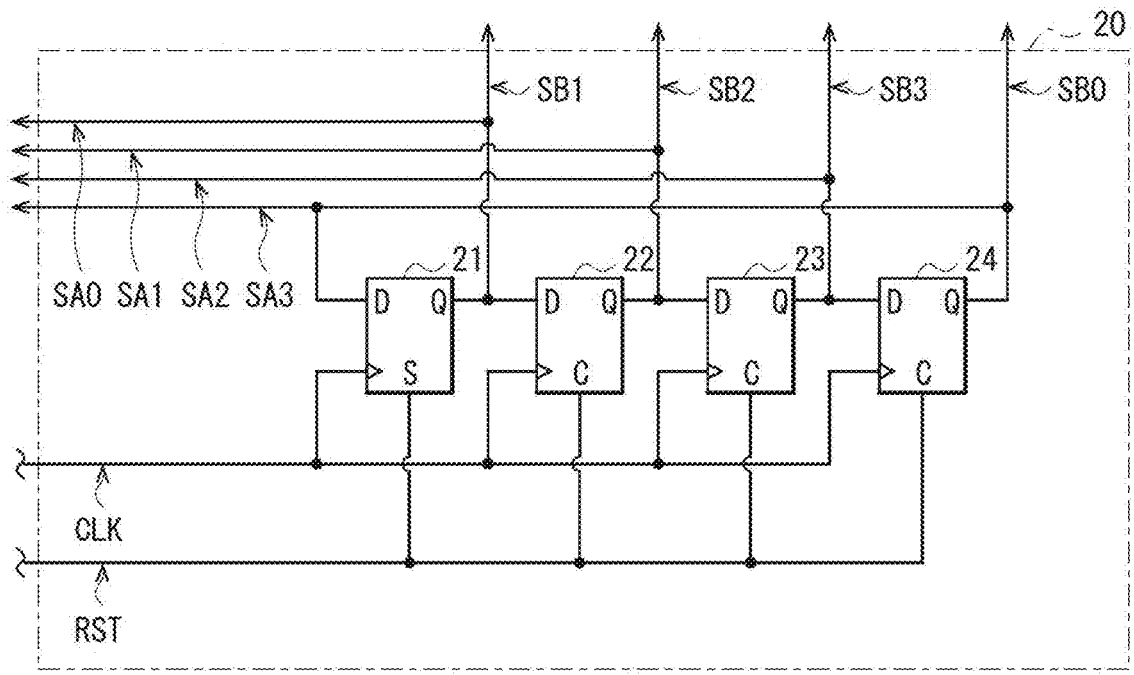
[ FIG. 3 ]
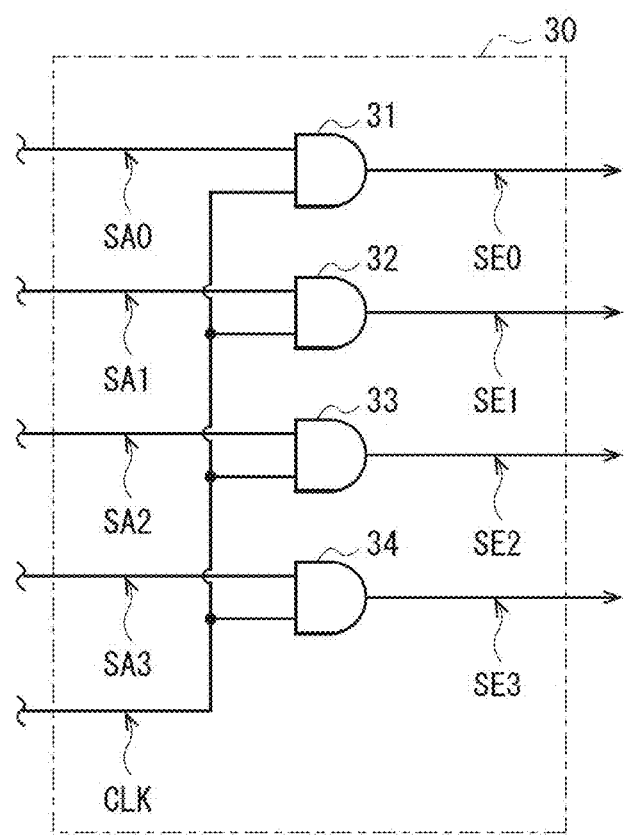

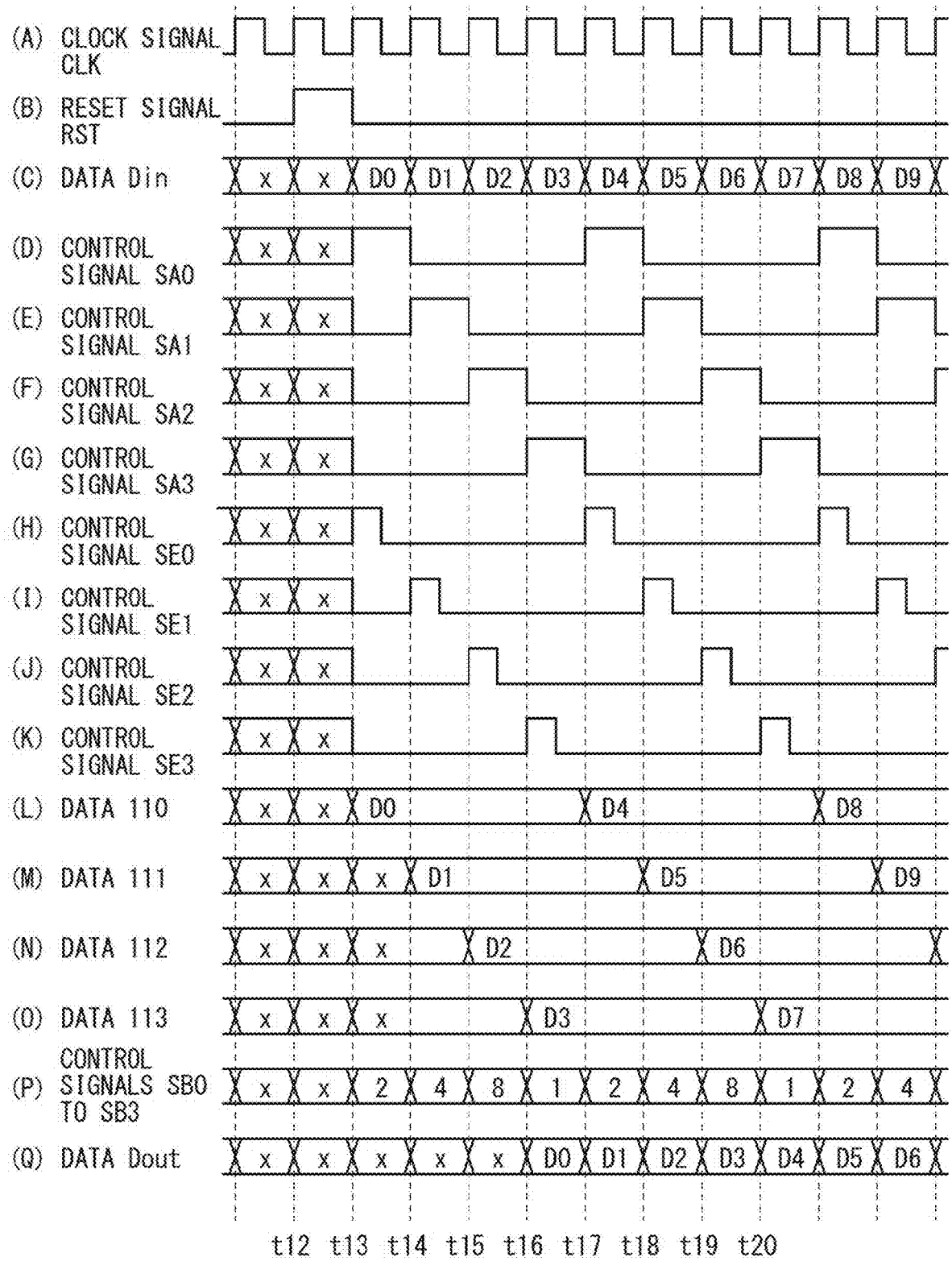
[FIG. 4]

[ FIG. 5 ]
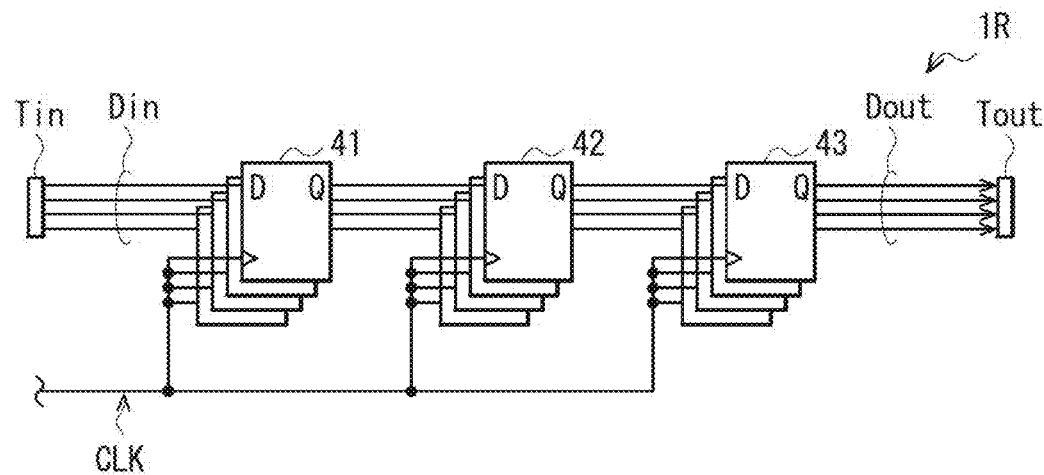
[ FIG. 6 ]
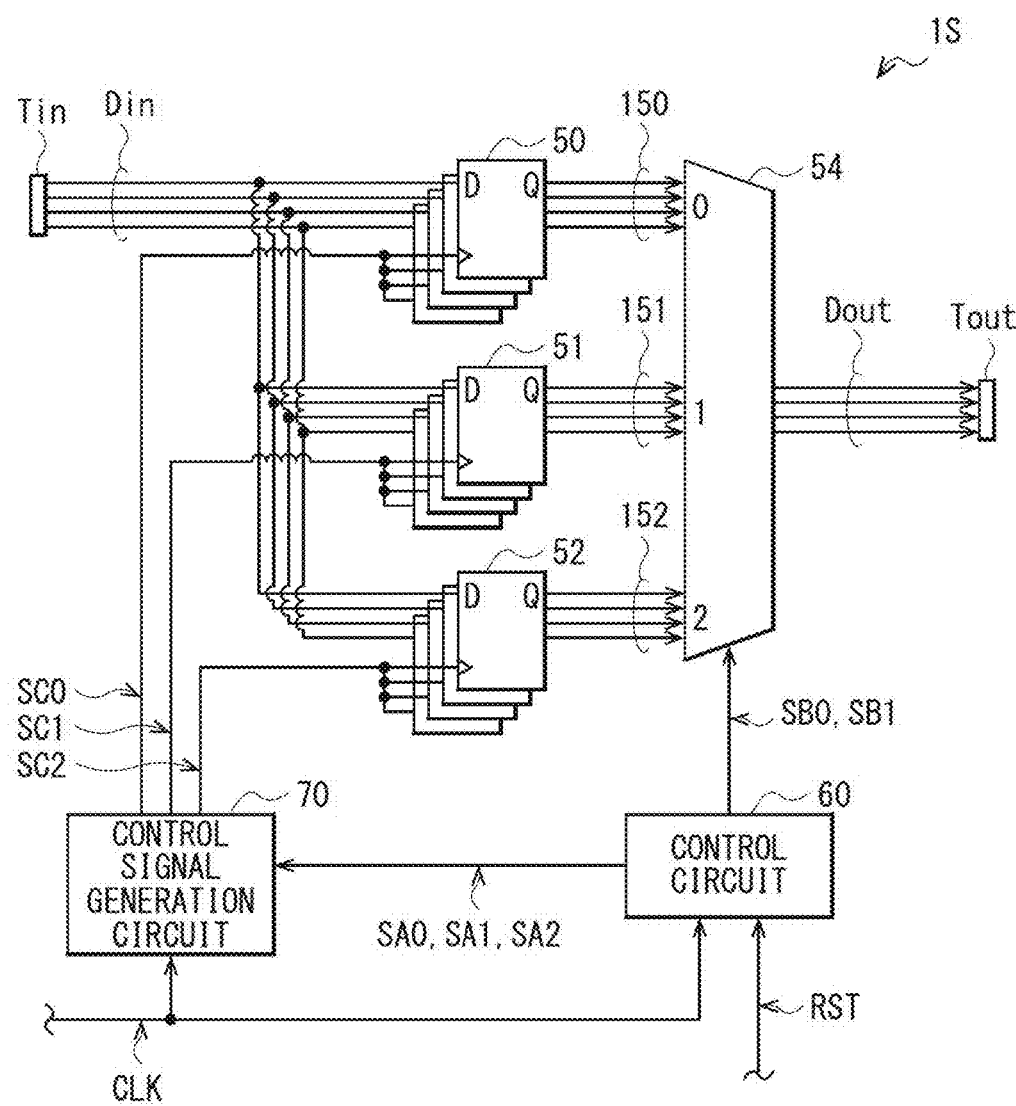

[ FIG. 7 ]
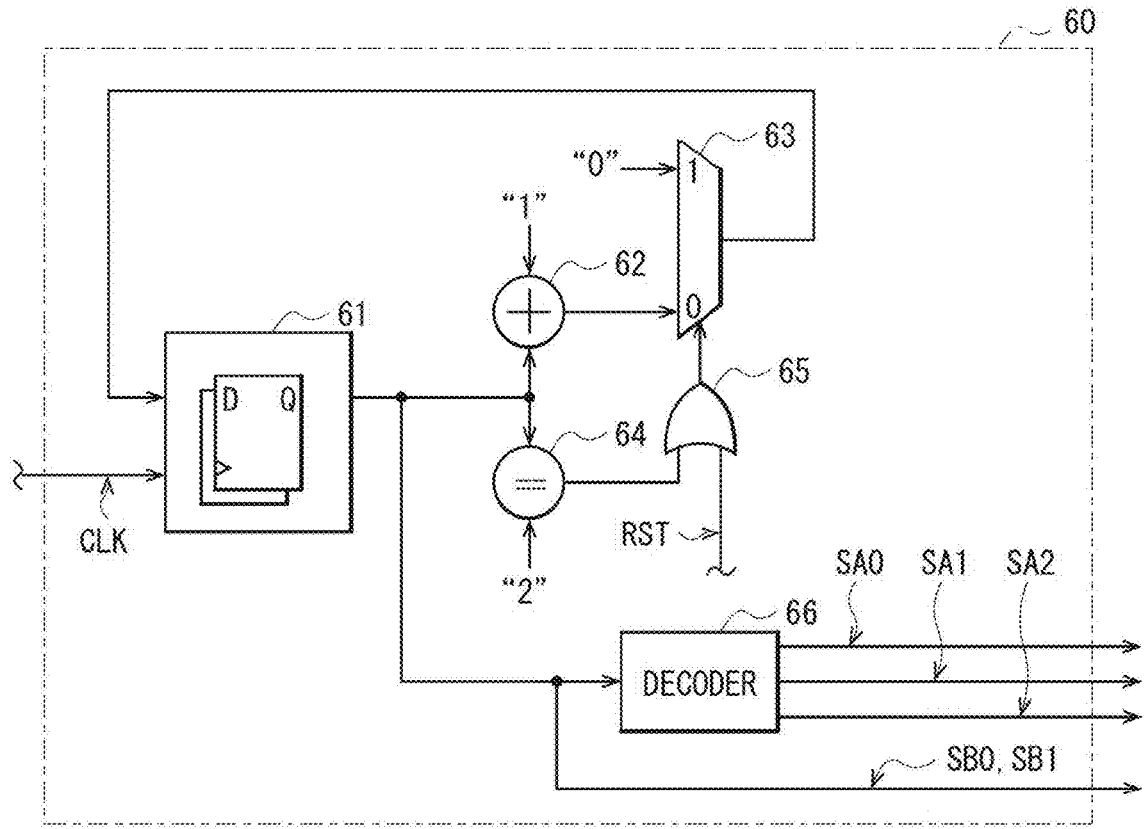
[ FIG. 8 ]
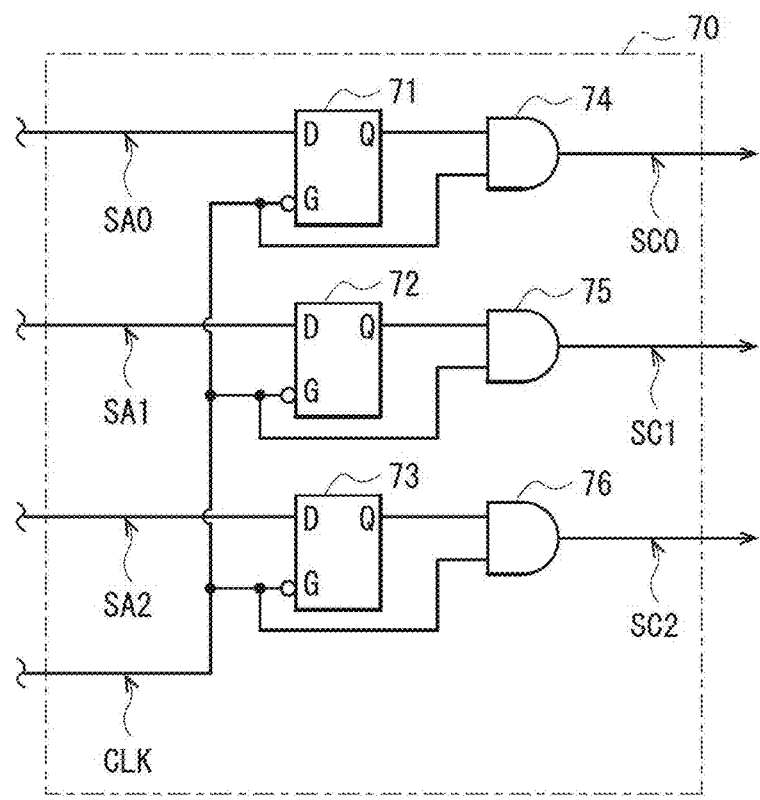

[FIG. 9]
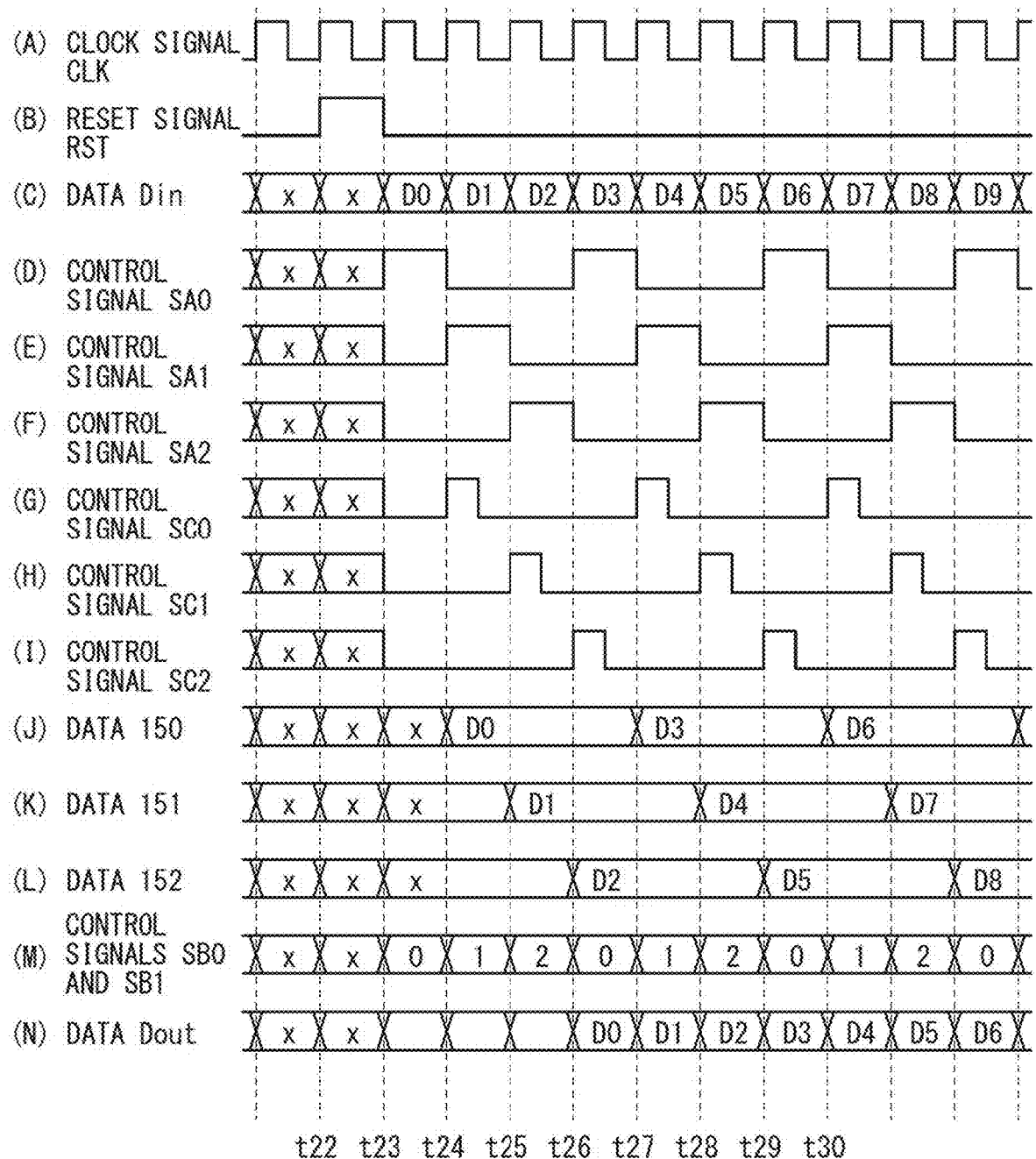

SEMICONDUCTOR CIRCUIT

TECHNICAL FIELD

The present disclosure relates to a semiconductor circuit configured to hold data.

BACKGROUND ART

For a semiconductor circuit, a circuit that holds data for a short time is often used. For example, PTL 1 discloses a data shift device that sequentially shifts data.

CITATION LIST

Patent Literature

PTL 1: Japanese Unexamined Patent Application Publication No. H6-231593

SUMMARY OF THE INVENTION

In semiconductor circuits, a First In First Out (FIFO) circuit is often used. For the semiconductor circuits, it is desirable to reduce a circuit area and power consumption.

It is desirable to provide a semiconductor circuit that makes it possible to reduce the circuit area and the power consumption.

A semiconductor circuit according to an embodiment of the present disclosure includes an input terminal, a plurality of latch circuits, a selector, and a control circuit. The plurality of latch circuits is configured to sequentially acquire data at the input terminal and each configured to perform an acquisition operation for acquiring the data at the input terminal or a holding operation for holding the acquired data, in accordance with a voltage level of a corresponding control signal out of a plurality of control signals. The selector is configured to perform a selection output operation for sequentially selecting any one of pieces of the data held by the plurality of latch circuits and for outputting the selected data. The control circuit is configured to control the operations of the plurality of latch circuits and the selector.

In the semiconductor circuit according to the embodiment of the present disclosure, the data at the input terminal is sequentially acquired by the plurality of latch circuits. The plurality of latch circuits performs the acquisition operation for acquiring the data at the input terminal or the holding operation for holding the acquired data, in accordance with the voltage level of the corresponding control signal out of the plurality of control signals. Then, by the selector, any one of the pieces of data held by the plurality of latch circuits is sequentially selected, and the selected data is outputted.

BRIEF DESCRIPTION OF DRAWING

FIG. 1 is a block diagram illustrating a configuration example of a FIFO circuit according to an embodiment of the present disclosure.

FIG. 2 is a circuit diagram illustrating a configuration example of a control circuit illustrated in FIG. 1.

FIG. 3 is a circuit diagram illustrating a configuration example of a control signal generation circuit illustrated in FIG. 1.

FIG. 4 is a timing waveform diagram illustrating an operation example of the FIFO circuit illustrated in FIG. 1.

FIG. 5 is a block diagram illustrating a configuration example of a FIFO circuit according to a comparative example.

FIG. 6 is a block diagram illustrating a configuration example of a FIFO circuit according to another comparative example.

FIG. 7 is a circuit diagram illustrating a configuration example of a control circuit illustrated in FIG. 6.

FIG. 8 is a circuit diagram illustrating a configuration example of a control signal generation circuit illustrated in FIG. 6.

FIG. 9 is a timing waveform diagram illustrating an operation example of the FIFO circuit illustrated in FIG. 6.

MODES FOR CARRYING OUT THE INVENTION

Hereinafter, an embodiment of the present disclosure is described in detail with reference to the drawings.

1. First Embodiment

Configuration Example

FIG. 1 illustrates a configuration example of a semiconductor circuit (FIFO circuit 1) according to an embodiment. The FIFO circuit 1 is, for example, a Complementary Metal Oxide Semiconductor (CMOS) circuit. The FIFO circuit 1 includes an input terminal Tin, latch circuits 10 to 13, a selector 14, an output terminal Tout, a control circuit 20, and a control signal generation circuit 30.

The input terminal Tin is a terminal to which data Din for one word is inputted. In this example, one word includes four bits. Note that, the one word is not limited to this, and for example, may be less than four bits and more than five bits.

Each of the latch circuits 10 to 13 acquires the data Din for one word supplied to the input terminal Tin and holds the acquired data. Each of the latch circuits 10 to 13 is a D-type latch circuit.

A terminal D of the latch circuit 10 is coupled to the input terminal Tin, a control signal SE0 is supplied to a terminal G, and a terminal Q is coupled to the selector 14. In a case where the control signal SE0 is at a high level, the latch circuit 10 acquires the data Din supplied to the input terminal Tin, and in a case where the control signal SE0 is at a low level, the latch circuit 10 holds the acquired data. Then, the latch circuit 10 outputs the holding data as data 110.

A terminal D of the latch circuit 11 is coupled to the input terminal Tin, a control signal SE1 is supplied to a terminal G, and a terminal Q is coupled to the selector 14. In a case where the control signal SE1 is at the high level, the latch circuit 11 acquires the data Din supplied to the input terminal Tin, and in a case where the control signal SE1 is at the low level, the latch circuit 11 holds the acquired data. Then, the latch circuit 11 outputs the holding data as data 111.

A terminal D of the latch circuit 12 is coupled to the input terminal Tin, a control signal SE2 is supplied to a terminal G, and a terminal Q is coupled to the selector 14. In a case where the control signal SE2 is at the high level, the latch circuit 12 acquires the data Din supplied to the input terminal Tin, and in a case where the control signal SE2 is at the low level, the latch circuit 12 holds the acquired data. Then, the latch circuit 12 outputs the holding data as data 112.

A terminal D of the latch circuit 13 is coupled to the input terminal Tin, a control signal SE3 is supplied to a terminal G, and a terminal Q is coupled to the selector 14. In a case where the control signal SE3 is at the high level, the latch circuit 13 acquires the data Din supplied to the input terminal Tin, and in a case where the control signal SE3 is at the low level, the latch circuit 13 holds the acquired data. The latch circuit 13 outputs the holding data as data 113.

The control signals SE0 to SE3 respectively to be supplied to the latch circuits 10 to 13 reach the high level in periods different from each other. This makes the latch circuits 10 to 13 to sequentially acquire the data supplied to the input terminal Tin, in the periods different from each other.

The selector 14 sequentially selects one of the pieces of data 110 to 113 respectively outputted from the latch circuits 10 to 13, on the basis of control signals SB0 to SB3 and outputs the selected data as data Dout. Specifically, the selector 14 outputs the data 110 outputted from the latch circuit 10 as the data Dout in a period in which the control signals SB3 to SB0 are "0001" (value is "1"), outputs the data 111 outputted from the latch circuit 11 as the data Dout in a period in which the control signals SB3 to SB0 are "0010" (value is "2"), outputs the data 112 outputted from the latch circuit 12 as the data Dout in a period in which the control signals SB3 to SB0 are "0100" (value is "4"), and outputs the data 113 outputted from the latch circuit 13 as the data Dout in a period in which the control signals SB3 to SB0 are "1000" (value is "8").

The output terminal Tout is a terminal that outputs the data Dout for one word.

The control circuit 20 controls an operation of the FIFO circuit 1, by generating control signals SA0 to SA3 and the control signals SB0 to SB3, on the basis of a clock signal CLK and a reset signal RST. Then, the control circuit 20 supplies the control signals SA0 to SA3 to the control signal generation circuit 30 and supplies the control signals SB0 to SB3 to the selector 14.

FIG. 2 illustrates a configuration example of the control circuit 20. The control circuit 20 includes flip-flop circuits 21 to 24. The flip-flop circuits 21 to 24 are D-type flip-flop circuits. The flip-flop circuits 21 to 24 are coupled to make a ring-like signal path.

A terminal D of the flip-flop circuit 21 is coupled to a terminal Q of the flip-flop circuit 24, the clock signal CLK is supplied to a clock terminal, the reset signal RST is supplied to a reset terminal S, and a terminal Q is coupled to a terminal D of the flip-flop circuit 22. This flip-flop circuit 21 samples a signal supplied from the flip-flop circuit 24 on the basis of a rising edge of the clock signal CLK. Furthermore, in a case where the reset signal RST is at the high level, the flip-flop circuit 21 performs a reset operation and sets a signal outputted from the terminal Q to the high level.

The terminal D of the flip-flop circuit 22 is coupled to the terminal Q of the flip-flop circuit 21, the clock signal CLK is supplied to a clock terminal, the reset signal RST is supplied to a reset terminal C, and a terminal Q is coupled to a terminal D of the flip-flop circuit 23. The flip-flop circuit 22 samples a signal supplied from the flip-flop circuit 21 on the basis of the rising edge of the clock signal CLK. The terminal D of the flip-flop circuit 23 is coupled to the terminal Q of the flip-flop circuit 22, the clock signal CLK is supplied to a clock terminal, the reset signal RST is supplied to a reset terminal C, and a terminal Q is coupled to a terminal D of the flip-flop circuit 24. The flip-flop circuit 23 samples a signal supplied from the flip-flop circuit 22 on the basis of the rising edge of the clock signal CLK. The terminal D of the flip-flop circuit 24 is coupled to the terminal Q of the flip-flop circuit 23, the clock signal CLK is supplied to a clock terminal, the reset signal RST is supplied to a reset terminal C, and the terminal Q is coupled to the terminal D of the flip-flop circuit 21. The flip-flop circuit 24 samples a signal supplied from the flip-flop circuit 23 on the basis of the rising edge of the clock signal CLK. In a case where the reset signal RST is at the high level, the flip-flop circuits 22 to 24 perform the reset operation and set the signal outputted from the terminal Q to the low level. That is, whereas the flip-flop circuit 21 has set the signal outputted from the terminal Q to the high level by performing the reset operation, the flip-flop circuits 22 to 24 set the signal outputted from the terminal Q to the low level by performing the reset operation.

With this configuration, in the control circuit 20, by the reset operation, an output signal of the flip-flop circuit 21 is set to the high level ("1"), and output signals of the flip-flop circuits 22 to 24 are set to the low level ("0"). Then, thereafter, each time when the clock signal CLK rises, the output signals of the flip-flop circuits 21 to 24 shift one by one. Specifically, the output signals of the flip-flop circuits 21 to 24 vary as "1000", "0100", "0010", and "0001" each time when the clock signal CLK rises. The control circuit 20 supplies the output signals of the flip-flop circuits 21 to 24 to the selector 14, respectively as the control signals SB1, SB2, SB3, and SB0. Furthermore, the control circuit 20 supplies the output signals of the flip-flop circuits 21 to 24 to the control signal generation circuit 30, respectively as the control signals SA0 to SA3.

The control signal generation circuit 30 (FIG. 1) generates the control signals SE0 to SE3 to be supplied to the latch circuits 10 to 13, on the basis of the clock signal CLK and the control signals SA0 to SA3.

FIG. 3 illustrates a configuration example of the control signal generation circuit 30. The control signal generation circuit 30 includes logical conjunction (AND) circuits 31 to 34. The AND circuit 31 obtains a logical conjunction of the control signal SA0 and the clock signal CLK and outputs the obtained result as the control signal SE0. The AND circuit 32 obtains a logical conjunction of the control signal SA1 and the clock signal CLK and outputs the obtained result as the control signal SE1. The AND circuit 33 obtains a logical conjunction of the control signal SA2 and the clock signal CLK and outputs the obtained result as the control signal SE2. The AND circuit 34 obtains a logical conjunction of the control signal SA3 and the clock signal CLK and outputs the obtained result as the control signal SE3.

Here, the latch circuits 10 to 13 correspond to a specific example of a "plurality of latch circuits" in the present disclosure. The selector 14 corresponds to a specific example of a "selector" in the present disclosure. The control circuit 20 and the control signal generation circuit 30 correspond to a specific example of a "control circuit" in the present disclosure. The flip-flop circuits 21 to 24 correspond to a specific example of a "plurality of flip-flop circuits" in the present disclosure.

[Operation and Workings]

Subsequently, the operation and workings of the FIFO circuit 1 according to the present embodiment are described.

(Overall Operation Outline)

First, an overall operation outline of the FIFO circuit 1 is described with reference to FIG. 1. Each of the latch circuits 10 to 13 acquires the data for one word supplied to the input terminal Tin and holds the acquired data. The latch circuits 10 to 13 respectively output the holding data as the pieces of data 110 to 113. The selector 14 sequentially selects one of the pieces of data 110 to 113 on the basis of the control signals SB0 to SB3 and outputs the selected data as the data Dout. The control circuit 20 controls the operation of the FIFO circuit 1, by generating the control signals SA0 to SA3 and SB0 to SB3, on the basis of the clock signal CLK and the reset signal RST. The control signal generation circuit 30 generates the control signals SE0 to SE3 to be supplied to the latch circuits 10 to 13, on the basis of the clock signal CLK and the control signals SA0 to SA3.

(Detailed Operation)

FIG. 4 illustrates an operation example of the FIFO circuit 1. (A) indicates a waveform of the clock signal CLK, (B) indicates a waveform of the reset signal RST, (C) indicates a waveform of the data Din, (D) to (G) indicate waveforms of the control signals SA0 to SA3, (H) to (K) indicate waveforms of the control signals SE0 to SE3, (L) to (O) indicate waveforms of the pieces of data 110 to 113, (P) indicates a value indicated by the control signals SB0 to SB3, and (Q) indicates a waveform of the data Dout. In FIG. 4, "x" is so-called "don't care" and indicates that "this may be any signal".

At a timing t12, the reset signal RST varies from the low level to the high level, and at a timing t13, the reset signal RST varies from the high level to the low level ((B) in FIG. 4). After the timing t13, pieces of data D0 to D3, . . . are supplied to the input terminal Tin in this order, as the data Din ((C) in FIG. 4).

For example, the control circuit 20 sets the control signal SA0 to the high level in a period between the timing t13 and a timing t14, sets the control signal SA1 to the high level in a period between the timing t14 to a timing t15, sets the control signal SA2 to the high level in a period between the timing t15 and a timing t16, and sets the control signal SA3 to the high level in a period between the timing t16 and a timing t17 ((D) to (G) in FIG. 4).

The control signal generation circuit 30 generates the control signal SE0 by obtaining the logical conjunction of the control signal SA0 and the clock signal CLK ((D) and (H) in FIG. 4), generates the control signal SE1 by obtaining the logical conjunction of the control signal SA1 and the clock signal CLK ((E) and (I) in FIG. 4), generates the control signal SE2 by obtaining the logical conjunction of the control signal SA2 and the clock signal CLK ((F) and (J) in FIG. 4), and generates the control signal SE3 by obtaining the logical conjunction of the control signal SA3 and the clock signal CLK ((G) and (K) in FIG. 4).

The latch circuit 10 acquires the data D0 of the data Din in a period that is a half of a clock cycle starting from the timing t13 on the basis of the control signal SE0 and holds the data D0 in a period from this time to the timing t17 ((H) and (L) in FIG. 4). The latch circuit 11 acquires the data D1 of the data Din in a period that is a half of a clock cycle starting from the timing t14 on the basis of the control signal SE1 and holds the data D1 in a period from this time to a timing t18 ((I) and (M) in FIG. 4). The latch circuit 12 acquires the data D2 of the data Din in a period that is a half of a clock cycle starting from the timing t15 on the basis of the control signal SE2 and holds the data D2 in a period from this time to a timing t19 ((J) and (N) in FIG. 4). The latch circuit 13 acquires the data D3 of the data Din in a period that is a half of a clock cycle starting from the timing t16 on the basis of the control signal SE3 and holds the data D3 in a period from this time to a timing t20 ((K) and (O) in FIG. 4).

The control circuit 20 generates the control signals SB0 to SB3 indicating "1" in a period between the timings t16 and t17 ((P) in FIG. 4). Specifically, the control circuit 20 sets the control signals SB3 to SB0 to "0001" in this period. As a result, the selector 14 selects the data 110 outputted from the latch circuit 10, in the period between the timings t16 and t17 and outputs the data D0 indicated by the data 110 as the data Dout ((L) and (Q) in FIG. 4).

The control circuit 20 generates the control signals SB0 to SB3 indicating "2" in a period between the timings t17 and t18 ((P) in FIG. 4). Specifically, the control circuit 20 sets the control signals SB3 to SB0 to "0010" in this period. As a result, the selector 14 selects the data 111 outputted from the latch circuit 11, in the period between the timings t17 and t18 and outputs the data D1 indicated by the data 111 as the data Dout ((M) and (Q) in FIG. 4).

The control circuit 20 generates the control signals SB0 to SB3 indicating "4" in a period between the timings t18 and t19 ((P) in FIG. 4). Specifically, the control circuit 20 sets the control signals SB3 to SB0 to "0100" in this period. As a result, the selector 14 selects the data 112 outputted from the latch circuit 12, in the period between the timings t18 and t19 and outputs the data D2 indicated by the data 112 as the data Dout ((N) and (Q) in FIG. 4).

The control circuit 20 generates the control signals SB0 to SB3 indicating "8" in a period between the timings t19 and t20 ((P) in FIG. 4). Specifically, the control circuit 20 sets the control signals SB3 to SB0 to "1000" in this period. As a result, the selector 14 selects the data 113 outputted from the latch circuit 13 in the period between the timings t19 and t20 and outputs the data D3 indicated by the data 113 as the data Dout ((O) and (Q) in FIG. 4).

Next, workings of the FIFO circuit according to the present embodiment are described in comparison with a FIFO circuit according to a comparative example.

Comparative Example R

FIG. 5 illustrates a configuration example of a FIFO circuit 1R according to the comparative example. The FIFO circuit 1R is a shift register type circuit. The FIFO circuit 1R includes flip-flop circuits 41 to 43. The flip-flop circuits 41 to 43 are D-type flip-flop circuits.

A terminal D of the flip-flop circuit 41 is coupled to the input terminal Tin, the clock signal CLK is supplied to a clock terminal, and a terminal Q is coupled to a terminal D of the flip-flop circuit 42. The flip-flop circuit 41 samples the data Din for one word supplied to the input terminal Tin, on the basis of the rising edge of the clock signal CLK.

The terminal D of the flip-flop circuit 42 is coupled to the terminal Q of the flip-flop circuit 41, the clock signal CLK is supplied to a clock terminal, and a terminal Q is coupled to a terminal D of the flip-flop circuit 43. The flip-flop circuit 42 samples data for one word supplied from the flip-flop circuit 41, on the basis of the rising edge of the clock signal CLK.

The terminal D of the flip-flop circuit 43 is coupled to the terminal Q of the flip-flop circuit 42, the clock signal CLK is supplied to a clock terminal, and a terminal Q is coupled to the output terminal Tout. The flip-flop circuit 43 samples data for one word supplied from the flip-flop circuit 42, on the basis of the rising edge of the clock signal CLK. Then, the flip-flop circuit 43 outputs the sampling result as the data Dout.

In this FIFO circuit 1R, each time when the clock signal CLK transitions, each of the flip-flop circuits 41 to 43 operates. Therefore, in the FIFO circuit 1R, power consumption increases. For example, as the number of words that are holdable by the FIFO circuit 1R increases, the power consumption increases.

Comparative Example S

FIG. 6 illustrates a configuration example of a FIFO circuit 1S according to another comparative example. The FIFO circuit 1S includes flip-flop circuits 50 to 52, a selector 54, a control circuit 60, and a control signal generation circuit 70. The flip-flop circuits 50 to 52 are D-type flip-flop circuits.

A terminal D of the flip-flop circuit 50 is coupled to the input terminal Tin, a control signal SC0 is supplied to a clock terminal, and a terminal Q is coupled to the selector 54. The flip-flop circuit 50 samples the data Din supplied to the input terminal Tin on the basis of a rising edge of the control signal SC0 and outputs the sampling result as data 150.

A terminal D of the flip-flop circuit 51 is coupled to the input terminal Tin, a control signal SC1 is supplied to a clock terminal, and a terminal Q is coupled to the selector 54. The flip-flop circuit 51 samples the data Din supplied to the input terminal Tin on the basis of a rising edge of the control signal SC1 and outputs the sampling result as data 151.

A terminal D of the flip-flop circuit 52 is coupled to the input terminal Tin, a control signal SC2 is supplied to a clock terminal, and a terminal Q is coupled to the selector 54. The flip-flop circuit 52 samples the data Din supplied to the input terminal Tin on the basis of a rising edge of the control signal SC2 and outputs the sampling result as data 152.

The selector 54 sequentially selects one of the pieces of data 150 to 152 on the basis of the control signals SB0 and SB1 and outputs the selected piece of data as the data Dout. Specifically, the selector 54 outputs the data 150 as the data Dout in a period in which the control signals SB1 and SB0 are "00" (value is "0"), outputs the data 151 as the data Dout in a period in which the control signals SB1 and SB0 are "01" (value is "1"), and outputs the data 152 as the data Dout in a period in which the control signals SB1 and SB0 are "10" (value is "2").

The control circuit 60 controls an operation of the FIFO circuit 1S by generating the control signals SA0, SA1, SA2, SB0, and SB1, on the basis of the clock signal CLK and the reset signal RST.

FIG. 7 illustrates a configuration example of the control circuit 60. The control circuit 60 includes a flip-flop circuit 61, an adder circuit 62, a selector 63, a comparison circuit 64, a logical OR (OR) circuit 65, and a decoder 66.

The flip-flop circuit 61 samples an output signal of the selector 63 on the basis of the rising edge of the clock signal CLK and outputs the sampling result. A value indicated by the signal supplied from the selector 63 may be values of zero, one, and two. Therefore, the flip-flop circuit 61 handles two-bit signals.

The adder circuit 62 adds a value "1" to the value indicated by an output signal of the flip-flop circuit 61 and outputs the addition result.

The selector 63 selects a signal indicating a value "0" in a case where an output signal of the OR circuit 65 is at the high level, and selects an output signal of the adder circuit 62 in a case where the output signal of the OR circuit 65 is at the low level. Then, the selector 63 outputs the selected signal.

The comparison circuit 64 compares the value indicated by the output signal of the flip-flop circuit 61 with a value "2". In a case where these values match, the comparison circuit 64 sets the output signal to the high level ("1"), and in a case where these values do not match, the comparison circuit 64 sets the output signal to the low level ("0").

The OR circuit 65 obtains a logical OR of the output signal of the comparison circuit 64 and the reset signal RST.

The decoder 66 generates the control signals SA0 to SA2 by decoding the output signal of the flip-flop circuit 61. For example, in a case where the value indicated by the output signal of the flip-flop circuit 61 is "0", the decoder 66 sets the control signals SA0, SA1, and SA2 to "100". In a case where the value indicated by the output signal of the flip-flop circuit 61 is "1", the decoder 66 sets the control signals SA0, SA1, and SA2 to "010". In a case where the value indicated by the output signal of the flip-flop circuit 61 is "2", the decoder 66 sets the control signals SA0, SA1, and SA2 to "001".

With this configuration, the control circuit 60 generates the control signals SA0, SA1, and SA2. Furthermore, the control circuit 60 outputs the output signal of the flip-flop circuit 61 as the control signals SB0 and SB1.

The control signal generation circuit 70 (FIG. 6) generates the control signals SC0 to SC2 to be supplied to the flip-flop circuits 50 to 52, on the basis of the clock signal CLK and the control signals SA0 to SA2.

FIG. 8 illustrates a configuration example of the control signal generation circuit 70. The control signal generation circuit 70 includes latch circuits 71 to 73 and AND circuits 74 to 76. The latch circuits 71 to 73 are D-type latch circuits.

The control signal SA0 is supplied to a terminal D of the latch circuit 71, an inversion signal of the clock signal CLK is supplied to a terminal G, and a terminal Q is coupled to the AND circuit 74. In a case where the clock signal CLK is at the low level, the latch circuit 71 acquires the control signal SA0, and in a case where the clock signal CLK is at the high level, the latch circuit 71 holds the acquired signal. The AND circuit 74 obtains a logical conjunction of an output signal of the latch circuit 71 and the clock signal CLK and outputs the obtained result as the control signal SC0. The latch circuit 71 and the AND circuit 74 are so-called Integrated Clock Gating (ICG) circuits.

The control signal SA1 is supplied to a terminal D of the latch circuit 72, the inversion signal of the clock signal CLK is supplied to a terminal G, and a terminal Q is coupled to the AND circuit 75. In a case where the clock signal CLK is at the low level, the latch circuit 72 acquires the control signal SA1, and in a case where the clock signal CLK is at the high level, the latch circuit 72 holds the acquired signal. The AND circuit 75 obtains a logical conjunction of an output signal of the latch circuit 72 and the clock signal CLK and outputs the obtained result as the control signal SC1. The latch circuit 72 and the AND circuit 75 are so-called ICG circuits.

The control signal SA2 is supplied to a terminal D of the latch circuit 73, the inversion signal of the clock signal CLK is supplied to a terminal G, and a terminal Q is coupled to the AND circuit 76. In a case where the clock signal CLK is at the low level, the latch circuit 73 acquires the control signal SA2, and in a case where the clock signal CLK is at the high level, the latch circuit 73 holds the acquired signal. The AND circuit 76 obtains a logical conjunction of an output signal of the latch circuit 73 and the clock signal CLK and outputs the obtained result as the control signal SC1. The latch circuit 73 and the AND circuit 76 are so-called ICG circuits.

FIG. 9 illustrates an operation example of the FIFO circuit 1S, (A) indicates a waveform of the clock signal CLK, (B) indicates a waveform of the reset signal RST, (C) indicates a waveform of the data Din, (D) to (F) indicate waveforms of the control signals SA0 to SA2, (G) to (I) indicate waveforms of the control signals SC0 to SC2, (J) to (L) indicate waveforms of the pieces of data 150 to 152, (M) indicates values indicated by the control signals SB0 and SB1, and (N) indicates a waveform of the data Dout.

At a timing t22, the reset signal RST varies from the low level to the high level, and at a timing t23, the reset signal RST varies from the high level to the low level ((B) in FIG. 9). After the timing t23, the pieces of data D0 to D3, ... are supplied to the input terminal Tin in this order, as the data Din ((C) in FIG. 9).

For example, the control circuit 60 sets the control signal SA0 to the high level in a period between the timing t23 and a timing t24, sets the control signal SA1 to the high level in a period between the timing t24 and a timing t25, and sets the control signal SA2 to the high level in a period between the timing t25 and a timing t26 ((D) to (F) in FIG. 9).

The control signal generation circuit 70 makes the control signal SC0 vary from the low level to the high level at the timing t24 on the basis of the control signal SA0 and the clock signal CLK and makes the control signal SC0 vary from the high level to the low level at a timing when a period of time that is a half of the clock cycle has elapsed from the timing t24 ((G) in FIG. 9). The control signal generation circuit 70 makes the control signal SC1 vary from the low level to the high level at the timing t25 on the basis of the control signal SA1 and the clock signal CLK and makes the control signal SC1 vary from the high level to the low level at a timing when a period of time that is a half of the clock cycle has elapsed from the timing t25 ((H) in FIG. 9). The control signal generation circuit 70 makes the control signal SC0 vary from the low level to the high level at the timing t26 on the basis of the control signal SA2 and the clock signal CLK and makes the control signal SC2 vary from the high level to the low level at a timing when a period of time that is a half of the clock cycle has elapsed from the timing t26 ((I) in FIG. 9).

The flip-flop circuit 50 acquires the data D0 by sampling the data Din on the basis of the rising edge of the control signal SC0 and outputs the data D0 as the data 150 ((J) in FIG. 9). The flip-flop circuit 51 acquires the data D1 by sampling the data Din on the basis of the rising edge of the control signal SC1 and outputs the data D1 as the data 151 ((K) in FIG. 9). The flip-flop circuit 52 acquires the data D2 by sampling the data Din on the basis of the rising edge of the control signal SC2 and outputs the data D2 as the data 152 ((L) in FIG. 9).

The control circuit 60 generates the control signals SB0 and SB1 indicating "0" in a period between the timing t26 and a timing t27 ((M) in FIG. 9). Specifically, the control circuit 60 sets the control signals SB1 and SB0 to "00" in this period. As a result, the selector 14 selects the data 150 outputted from the flip-flop circuit 50 in the period between the timings t26 and t27 and outputs the data D0 indicated by the data 150 as the data Dout ((J) and (N) in FIG. 9).

The control circuit 60 generates the control signals SB0 and SB1 indicating "1" in a period between the timing t27 and a timing t28 ((M) in FIG. 9). Specifically, the control circuit 60 sets the control signals SB1 and SB0 to "01" in this period. As a result, the selector 14 selects the data 151 outputted from the flip-flop circuit 51 in the period between the timings t27 and t28 and outputs the data D1 indicated by the data 151 as the data Dout ((K) and (N) in FIG. 9).

The control circuit 60 generates the control signals SB0 and SB1 indicating "2" in a period between the timing t28 and a timing t29 ((M) in FIG. 9). Specifically, the control circuit 60 sets the control signals SB1 and SB0 to "10". As a result, the selector 14 selects the data 152 outputted from the flip-flop circuit 52 in the period between the timings t28 and t29 and outputs the data D2 indicated by the data 152 as the data Dout ((L) and (N) in FIG. 9).

Unlike the FIFO circuit 1R (FIG. 5), in the FIFO circuit 1S, each time when the clock signal CLK transitions, any one of the flip-flop circuits 71 to 73 operates. In the FIFO circuit 1S, for example, even in a case where the number of words of holdable data is larger, the single flip-flop circuit operates. Therefore, in the FIFO circuit 1S, it is possible to reduce the power consumption as compared with the FIFO circuit 1R. Furthermore, because it is possible to suppress a peak value of a current flowing into a power supply at the time of switching in the FIFO circuit 1S, it is possible to reduce a noise amount of switching noise at a power supply voltage.

However, the control circuit 60 of the FIFO circuit 1S becomes complicated, and a fan-out number increases. Therefore, arrangement and wiring of a circuit become complicated. Furthermore, as illustrated in FIG. 6, because the flip-flop circuits 50 to 52 operate on the basis of the control signals SC0 to SC2, high waveform quality of the control signals SC0 to SC2 is requested. Therefore, a circuit configuration of the control signal generation circuit 70 (FIG. 8) becomes slightly more complicated.

On the other hand, in the FIFO circuit 1 according to the present embodiment (FIGS. 1 to 3), the latch circuits 10 to 13 have been provided, not the flip-flop circuits. Because a circuit size of the latch circuit is about a half of a circuit size of the flip-flop circuit, it is possible to reduce a circuit area, and it is possible to reduce the power consumption. Note that, in the latch circuit, if a writing period and a reading period overlap, there is a possibility that a failure occurs. Therefore, in the FIFO circuit 1, the latch circuit for one word is added to the FIFO circuit 1S. In the FIFO circuit 1, because any one of such latch circuits 10 to 13 operates each time when the clock signal CLK transitions, it is possible to reduce the power consumption. In the FIFO circuit 1, because the single latch circuit operates, for example, even in a case where the number of words of holdable data is larger, it is possible to reduce the power consumption. Furthermore, in the FIFO circuit 1, because it is possible to suppress the peak value of the current flowing into the power supply at the time of switching, it is possible to reduce the noise amount of the switching noise at the power supply voltage, and it is possible to suppress a fluctuation between power consumption at the time of activation and power consumption at the time of non-activation.

Furthermore, in the FIFO circuit 1, because it is possible to simplify a circuit configuration of the control circuit 20 as illustrated in FIG. 2, it is possible to simplify the arrangement and the wiring of the circuit. Furthermore, because the latch circuits 10 to 13 operate on the basis of the control signals SE0 to SE3 as illustrated in FIG. 1, waveform quality of the control signals SE0 to SE3 does not have to be very high. Therefore, it is possible to simplify a circuit configuration of the control signal generation circuit 30 (FIG. 3).

In this way, in the FIFO circuit 1, the input terminal Tin, the plurality of latch circuits 10 to 13 configured to sequentially acquire the data Din at the input terminal Tin and each configured to perform an acquisition operation for acquiring the data Din at the input terminal Tin or a holding operation for holding the acquired data, in accordance with a voltage level of a corresponding control signal out of the plurality of control signals SE0 to SE3, the selector 14 configured to perform a selection output operation for sequentially selecting any one of the pieces of data held by the plurality of latch circuits 10 to 13 and outputting the selected data, and the control circuit 20 and the control signal generation circuit 30 that are configured to control the operations of the plurality of latch circuits 10 to 13 and the selector 14 have been provided. As a result, for example, as compared with the FIFO circuit 1R (FIG. 5) and the FIFO circuit 1S (FIG. 6), it is possible to reduce the circuit area, and it is possible to reduce the power consumption.

[Effects]

As described above, in the present embodiment, because the input terminal, the plurality of latch circuits configured to sequentially acquire the data at the input terminal and each configured to perform the acquisition operation for acquiring the data at the input terminal or the holding operation for holding the acquired data, in accordance with the voltage level of the corresponding control signal out of the plurality of control signals, the selector configured to perform the selection output operation for sequentially selecting any one of the pieces of data held by the plurality of latch circuits and outputting the selected data, and the control circuit and the control signal generation circuit that are configured to control the operations of the plurality of latch circuits and the selector are provided, it is possible to reduce the circuit area, and it is possible to reduce the power consumption.

Although the present technology has been described above using the embodiment, the present technology is not limited to the embodiment or the like, and it is possible to make various modifications.

For example, in the above embodiment, the four latch circuits 10 to 13 have been provided. However, the embodiment is not limited to this, and for example, two or three latch circuits may be provided or five or more latch circuits may be provided, instead of this.

Furthermore, in the above embodiment, one word is set to include four bits. However, the embodiment is not limited to this, and for example, one word may include less than four bits or more than five bits, instead of this.

Note that the effects described herein are merely examples and not limited, and in addition, other effects may be provided.

Note that it is possible for the present technology to have the following configuration. According to the present technology with the following configuration, it is possible to reduce the circuit area and the power consumption.

(1)

A semiconductor circuit including:
an input terminal;
a plurality of latch circuits configured to sequentially acquire data at the input terminal and each configured to perform an acquisition operation for acquiring the data at the input terminal or a holding operation for holding the acquired data, in accordance with a voltage level of a corresponding control signal out of a plurality of control signals;
a selector configured to perform a selection output operation for sequentially selecting any one of pieces of the data held by the plurality of latch circuits and for outputting the selected data; and
a control circuit configured to control the operations of the plurality of latch circuits and the selector.

(2)

The semiconductor circuit according to (1), in which
the control circuit includes a plurality of flip-flop circuits as many as the plurality of latch circuits, the plurality of flip-flop circuits being coupled to make a ring-like signal path, and
the control circuit is configured to control the operations of the plurality of latch circuits and the selector, on the basis of output signals of the plurality of flip-flop circuits.

(3)

The semiconductor circuit according to (1) or (2), in which the control circuit is configured to control the plurality of latch circuits to sequentially perform the acquisition operation and is configured to control the selector to perform the selection output operation in same order as the acquisition operation.

(4)

The semiconductor circuit according to any one of (1) to (3), in which the data includes bit data including a plurality of bits.

The present application claims the benefit of Japanese Priority Patent Application JP2022-004938 filed with the Japan Patent Office on Jan. 17, 2022, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor circuit comprising:
an input terminal;
a plurality of latch circuits configured to sequentially acquire data at the input terminal and each configured to perform an acquisition operation for acquiring the data at the input terminal or a holding operation for holding the acquired data, in accordance with a voltage level of a corresponding control signal out of a plurality of control signals;
a selector configured to perform a selection output operation for sequentially selecting any one of pieces of the data held by the plurality of latch circuits and for outputting the selected data; and
a control circuit configured to control the operations of the plurality of latch circuits and the selector.

2. The semiconductor circuit according to claim 1, wherein
the control circuit includes a plurality of flip-flop circuits as many as the plurality of latch circuits, the plurality of flip-flop circuits being coupled to make a ring-like signal path, and
the control circuit is configured to control the operations of the plurality of latch circuits and the selector, on a basis of output signals of the plurality of flip-flop circuits.

3. The semiconductor circuit according to claim 1, wherein the control circuit is configured to control the plurality of latch circuits to sequentially perform the acquisition operation and is configured to control the selector to perform the selection output operation in same order as the acquisition operation.

4. The semiconductor circuit according to claim 1, wherein the data includes bit data including a plurality of bits.

* * * * *